United States Patent [19]

Hirano et al.

[11] Patent Number: 4,762,588
[45] Date of Patent: Aug. 9, 1988

[54] METHOD OF MANUFACTURING CALCIUM CARBONATE SINGLE CRYSTAL

[75] Inventors: Shinichi Hirano, 123 Meidai Yadacho Syukusya, 66 Yada-cho 2-chome, Higashi-ku, Aichi; Ryo Toyokuni; Hiroshi Kuroda, both of Tokyo, all of Japan

[73] Assignees: Seiko Instruments & Electronics Ltd.; Shinichi Hirano, both of Tokyo, Japan

[21] Appl. No.: 924,402

[22] Filed: Oct. 29, 1986

[30] Foreign Application Priority Data

Nov. 12, 1985 [JP] Japan .................................. 60-253124

[51] Int. Cl.$^4$ .............................................. C30B 7/10
[52] U.S. Cl. ........................... 156/623 R; 156/621; 156/623 Q; 156/DIG. 78; 423/340
[58] Field of Search ............... 156/621, 623 R, 623 Q, 156/DIG. 78; 423/340

[56] References Cited

U.S. PATENT DOCUMENTS

| | | | |
|---|---|---|---|
| 3,201,209 | 8/1965 | Caporaso et al. | 156/623 |
| 3,271,114 | 9/1966 | Kolb | 23/273 |
| 3,356,463 | 12/1967 | Ballman et al. | 156/623 Q |
| 3,440,025 | 4/1969 | Laudise et al. | 156/623 |
| 3,663,180 | 5/1972 | Brissot | 23/301 SP |
| 4,019,950 | 4/1977 | Croxall et al. | 156/623 R |

FOREIGN PATENT DOCUMENTS 1049347 11/1966 United Kingdom .
431703 10/1975 U.S.S.R. .

OTHER PUBLICATIONS

Balascio et al, Hydrothermal Growth of Calcite from Alkali Carbonate Solutions, Mat. Res. Bull., vol. 7, No. 12, pp. 1461–1472, 1972.
Brice, The Growth of Crystals from Liquids, North-Holland Publishing Co., Amterdam, 1973, pp. 12–14.
Kinlock et al., Hydrothermal Growth of Calcite Inlarge Autoclaves, Journel of Crystal Growth 24/25, 1974, 610–613.
Lobachev, Crystallization Processes Under Hydrothermal Conditions Consultants Bureau, New York-London 1973.

Primary Examiner—John Doll
Assistant Examiner—Robert M. Kunemund
Attorney, Agent, or Firm—Bruce L. Adams; Van C. Wilks

[57] ABSTRACT

A starting material composed of calcium carbonate is dissolved in a nitrate aqueous solution containing alkali nitrate under application of heat and pressure. The starting material is hydrothermally synthesized within the nitrate aqueous solution to effect the rapid growth of calcium carbonate single crystal.

28 Claims, 1 Drawing Sheet

METHOD OF MANUFACTURING CALCIUM CARBONATE SINGLE CRYSTAL

BACKGROUND OF THE INVENTION

This invention relates to a method of manufacturing calcium carbonate single crystal (calcite) widely used for an optical polarizer, etc.

Single crystals of calcium carbonate ($CaCO_3$) are suitable for optical uses and, for this purpose, natural calcite crystals are currently used. Calcite single crystals exhibit double refraction of incident light. Calcite has a high refractive index and is used as a polarizing prism in an optical apparatus. Because of recent advances in the design of apparatus such as laser optics and an optical communication apparatus, there is an increased demand for a material with excellent optical characteristics. In this regard, calcite single crystal is an ideal material, and is expected to be more and more in demand.

Calcite single crystal has been obtained only from natural sources because it is not yet being industrially synthesized. For commercial use, natural calcite must be colourless and transparent, must have no bubbles or cracks, no twining, and no internal strains, and must be greater than a certain size. However, calcite single crystal that will meet this requirement is found only in limited quantities in the Republic of South Africa, Mexico, etc., and reserves are running low.

There have been experiments to synthesize calcium carbonate single crystal. One method is crystallization from a solvent, another is the synthesizing from a gel, a third is crystallization from a flux or melt, a fourth is hydrothermal synthesis, and recently an FZ method under high pressure have been suggested. However, optical characteristics such as transparency of resultant crystals are not entirely satisfactory due to defects such as impurities, mixing, dislocations, inclusions, or internal strains.

Among the methods tried for the manufacture of calcium carbonate single crystal, hydrothermal synthesis is most similar to the process by which natural calcite is grown as a hydrothermal ore deposit. Therefore, hydrothermal synthesis can produce a desired calcium carbonate single crystal with characteristics similar to natural calcite.

The hydrothermal synthesis process for manufacturing calcium carbonate single crystal utilizes an aqueous solvent at held a fixed temperature and pressure in an autoclave. Alkaline aqueous solutions such as sodium hydroxide (NaOH) or alkali carbonate aqueous solutions such as sodium carbonate ($Na_2CO_3$), potassium carbonate ($K_2CO_3$), etc. are generally used as the aqueous solvent. This method for growth of calcium carbonate single crystal is essentially a modification of conventional growth technology for artificial crystals. Under the following conditions:

Solvent—6 mol $K_2CO_3$ aqueous solution
Temperature—410° to 445° C.
Pressure—1720 atmospheres
Growth speed—50 $\mu$m/day about 3 mm growth layer of a calcium carbonate single crystal has been obtained.

The above described hydrothermal synthesis is disclosed in D. R. Kinlock H, R. F Belt, R. C. Puttbac H, Journal of Crystal Growth 24/25 (1974) 610–613.

The inventors have invented a new method and filed U.S. patent application Ser. No. 840,670) with respect to a method of manufacturing calcium carbonate single crystal grown by hydrothermal synthesis using a chloride aqueous solution.

SUMMARY OF THE INVENTION

Calcium carbonate crystals can be grown from an alkali carbonate aqueous solution by a hydrothermal synthesis as described above, but there are problems. Firstly, due to the high concentration of solvent, inclusions frequently occur in the resultant crystals. These inclusions will result in inferior optical characteristics. Next, due to a high concentration of solvent, it is impossible to achieve sufficient pressure for quantitative production. In other words, the higher the solvent concentration, the lower the obtained pressure becomes even with the same filling-up rate. In the case of a 6 mol concentration of $K_2CO_3$ aqueous solution at 445° C. and a filling-up rate of nearly 100%, it is impossible to obtain a pressure of 1720 atmospheres. Due to this, it is necessary to apply additional pressure from outside the autoclave, thereby causing the apparatus and pressure system etc. to be too complicated. Using an alkali carbonate aqueous solution, the growth speed will be very slow, i.e., 50 $\mu$m/day, and therefore it will take more or less a year to grow crystals large enough to be used as optical elements.

It is an object of the invention to provide a simple method to grow relatively quickly excellent calcium carbonate single crystal with good optical characteristics.

According to the present invention, there is provided a method for manufacturing a calcium carbonate single crystal by hydrothermal synthesis at a given temperature and pressure within a nitrate aqueous solution as a solvent.

DETAILED DESCRIPTION OF THE INVENTION

The problems encountered in growing calcium carbonate single crystal by the prior art hydrothermal synthesis, namely, inferior optical quality, complicated apparatus, and long growth period, etc. result from having to use a high concentration solvent and high pressure. In other words, the problems stem from the choice of solvent and growth conditions.

A nitrate aqueous solution is now found best to avoid these problems, among various kinds of existing solvent such as alkaline, carbonate, acid and chloride solutions.

In the present invention, hydrothermal synthesis initiating material is dissolved in a suitable aqueous solution of solvent at an appropriate temperature and pressure, and crystallization on a substrate is effected by gradual cooling or by transporting nourishment (material) through a temperature differential. The solvent should, therefore, be such that the starting material dissolves well in it and it should have little corrosive action on the apparatus used. A nitrate aqueous solution as a solvent is found to be ideal.

The invention is further described with reference to the following Examples.

EXAMPLE 1

Figure 1:
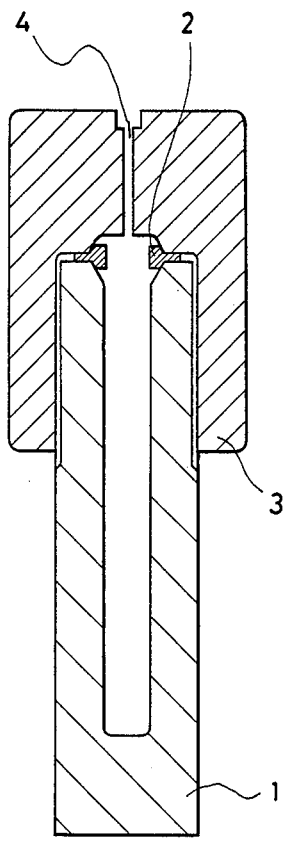
FIG. 1 is a sectional view of a test tube used in Example 1 according to the present invention.

As starting material, commercially available calcium carbonate of high purity was used. For hydrothermal synthesis, an autoclave test tube of stellite quality No. 25 was used. FIG. 1 shows the structure of the test tube having a pressure vessel body 1 with a cover 3 and a seal 2.

The inside temperature of the pressure vessel body was measured through a temperature measuring hole 4. A gold capsule, 3 mm–5 mm in diameter was placed in the test tube. The starting material and solvent were poured into the test tube for hydrothermal synthesis. In this case, the pressure between the inside and the outside of the capsule was balanced by filling the inside of the pressure vessel with distilled water.

By using various solvents, the result of growing crystal for each solvent and the hydrothermal treatment conditions are shown in the following table:

| Solvent | Conditions of Hydrothermal Synthesis | | Size of Crystal Obtained |
|---|---|---|---|
| 3 Mol NaNO$_3$ | Temp. Pressure Growth Period | 300° C. 750 kg/cm$^2$ 7 days | 0.2 mm–0.3 mm |
| 3 Mol NaNO$_3$ | Temp. Pressure Growth Period | 300° C. 750 kg/cm$^2$ 7 days | 0.2 mm–0.3 mm |
| 3 Mol NaNO$_3$ | Temp. Pressure Growth Period | 370° C. 750 kg/cm$^2$ 7 days | 0.3 mm–0.5 mm |
| 3 Mol NaNO$_3$ | Temp. Pressure Growth Period | 420° C. 500 kg/cm$^2$ 7 days | 0.1 mm–0.2 mm |
| 3 Mol KNO$_3$ | Temp. Pressure Growth Period | 400° C. 750 kg/cm$^2$ 7 days | 0.5 mm–0.6 mm |
| 3 Mol KNO$_3$ | Temp. Pressure Growth Period | 400° C. 1000 kg/cm$^2$ 7 days | 0.6 mm–0.8 mm |
| 3 Mol LiNO$_3$ | Temp. Pressure Growth Period | 380° C. 750 kg/cm$^2$ 7 days | 0.3 mm–0.5 mm |
| 3 Mol LiNO$_3$ | Temp. Pressure Growth Period | 420° C. 750 kg/cm$^2$ 7 days | 0.6 mm–1.0 mm |
| 3 Mol NaNO$_3$ | Temp. Pressure Growth Period | 450° C. 750 kg/cm$^2$ 7 days | 0.8 mm–1.0 mm |
| 3 Mol NaNO$_3$ | Temp. Pressure Growth Period | 500° C. 750 kg/cm$^2$ 7 days | 1.0 mm–1.2 mm |

As shown in the above table, it was found that crystals were grown by using any one of NaNO$_3$, KNO$_3$ and LiNO$_3$ as the solvent. By making the concentration of the nitrate in the aqueous solution relatively large, good crystal growth was achieved. However, it was found that a molar concentration of about 3 Mol was preferred in view of the pressure and because it was easier to handle. As for pressure, unlike the case of using an alkali carbonate aqueous solution, it was possible to grow crystals at pressures less than 1000 kg/cm$^2$, and a very good crystal growth at pressures of around 750 kg/cm$^2$ were achieved. However, at a pressure of 500 kg/cm$^2$, crystalline growth was found to be very slow. As for temperature, it was possible to grow crystal in the range of 300° C. to 500° C., preferably in the range of 370° C. to 420° C. If the temperature was below 370° C., it was still possible to grow crystals, however, the speed of growth is very slow. If the temperature was over 420° C., it was still possible to grow crystals, however, there was the possibility of reduced quality.

It was identified by X-ray diffraction that in each case the crystals grown were calcium carbonate single crystals.

EXAMPLE 2

Figure 2:
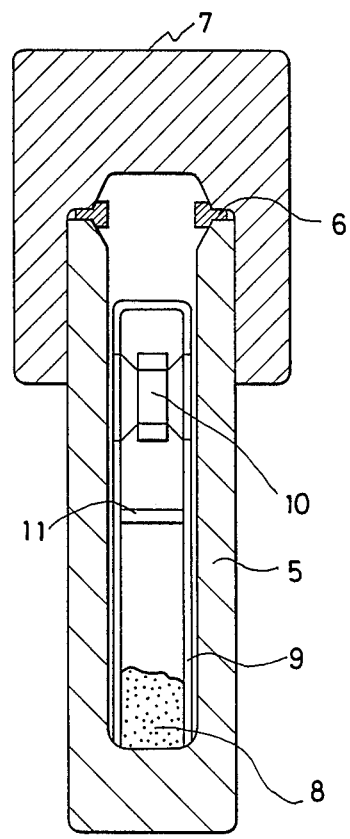
FIG. 2 is a sectional view of a pressure vessel used in Example 2 according to the present invention.

FIG. 2 is a sectional view illustrating a typical test tube used in this Example. The test tube was made of stellite 25 as in Example 1, however the inside was lined with platinum in order to avoid contamination by pollutants. A pressure vessel body 5 was sealed with a cover 7 through a sealing ring 6. At the bottom of the pressure bessel body 5, starting material 8 for the crystals to be grown is placed. The starting material was according to the method of Example 1 refined and recrystallised in sodium nitrate (NaNO$_3$) and was powdered. A crystal support frame 9 carried thereon a species or seed crystal 10 over the starting material 8 at an upper portion of the pressure vessel. The seed crystal 10 was a calcite (1011) faces of natural optical grade. It was necessary to choose a seed crystal with few internal inclusions, and little lattice displacement, etc. so that defects in the single crystal to be grown thereon may be avoided. A baffle 11 was provided between the starting material 8 and the seed crystal 10 to produce a temperature difference therebetween and was supported on the frame 9. The inside of the pressure vessel body 5 was filled up with 3 mol sodium nitrate (NaNO$_3$) aqueous solution as solvent at such a filling-up rate as to establish a predetermined temperature and pressure.

Hydrothermal synthesis was conducted under the same conditions as in Example 1, namely, Temperature of seed crystal 10—370° C.
Temperature of starting material 8—420° C.
Solvent—3 Mol NaNO$_3$ aqueous solution
Pressure—750 kg/cm$^2$
Growth Period—50 days As a result, a calcium carbonate single crystal was grown on the seed crystal 10 as follows:

Thickness of grown layer or film—6.6 mm
Growth speed—132 μm/day
Characteristics of grown layer: calcium carbonate single crystal (identified by X-ray diffraction). Its optical characteristics was the same as those of natural calcite (with respect to permeability rate, compound refractive index, etc.).

Having described a specific embodiment of our bearing, it is believed obvious that modification and variation of our invention is possible in light of the above teachings.

From the above discussion, it will be appreciated that it is easier for growth of calcium carbonate single crystals to be industrialized by hydrothermal synthesis because a pressure less than 1000 kg/cm$^2$ is used and, at the same time, defects inside the grown crystals are reduced as, compared with the prior art growth methods of calcium carbonate single crystal using alkali carbonate aqueous solutions. In addition, the growth speed of the crystals is over twice that achieved by the prior art method and this is a very favourable feature view of industrialization. It is thus possible for calcium carbonate single crystals of optical grade quality equal to that of natural calcite to be made industrially by the same technology as that for the current artificial crystals. To be industrially able to produce such crystals equal in quality to natural optical grade calcite will mean that it will be possible always to provide a market with such crystals with the same quality. Because of the dependence upon natural calcite, there has been no guarantee of either a regular supply or consistent quality. Industrialization of calcium carbonate single crystal will achieve such consistency and enhance their use in optical elements and parts etc. used in a whole range of apparatus and will enable their characteristics to be improved.

What is claimed is:

1. A method of manufacturing calcium carbonate single crystal wherein the calcium carbonate single crystal is grown by hydrothermal synthesis which applies heat and pressure to a starting material composed of calcium carbonate crystal within a nitrate aqueous solution at a temperature and pressure effective to grow the calcium carbonate single crystal.

2. The method according to claim 1; wherein said hydrothermal synthesis is carried out at a temperature above 300° C.

3. The method according to claim 1; wherein said hydrothermal synthesis is carried out at a temperature below 500° C.

4. The method according to claim 1; wherein said hydrothermal synthesis is carried out at a temperature in the range of 370° to 420° C.

5. The method according to claim 1; wherein said nitrate is alkali nitrate.

6. The method according to claim 5; wherein said alkali nitrate is selected from $NaNO_3$, $KNO_3$ and $LiNO_3$.

7. The method according to claim 5; wherein the alkali nitrate aqueous solution comprises 3 mol aqueous solution of alkali nitrate.

8. The method according to claim 1; wherein the hydrothermal synthesis is carried out under a pressure less than 1000 $kg/cm^2$.

9. The method according to claim 8; wherein the hydrothermal synthesis is carried out under a pressure of around 750 $kg/cm^2$.

10. The method according to claim 1; wherein the hydrothermal synthesis is carried out in a pressure vessel and the calcium carbonate single crystal is deposited on the inside surface of the pressure vessel.

11. The method according to claim 1; wherein the calcium carbonate single crystal is grown on a seed crystal.

12. The method according to claim 1; wherein said hydrothermal synthesis is carried out in a pressure vessel, the starting material being placed at the bottom of said pressure vessel and a seed crystal being placed at the upper part of said pressure vessel.

13. The method according to claim 12; wherein said seed crystal is maintained about 50° C. lower than the starting material, whereby said single crystal is grown on the seed crystal.

14. The method according to claim 13; wherein said pressure vessel is provided with a baffle located in the nitrate aqueous solution between the starting material and the seed crystal to maintain the temperature difference therebetween.

15. A method of manufacturing calcium carbonate single crystal comprising the steps of: providing a starting material composed of calcium carbonate; dissolving the starting material in a nitrate aqueous solution under application of heat and pressure; and hydrothermally synthesizing the starting material within the nitrate aqueous solution at a temperature and pressure effective to effect the growth of calcium carbonate single crystal.

16. A method according to claim 15; wherein the starting material is hydrothermally synthesized within the nitrate aqueous solution at a temperature above 300° C.

17. A method according to claim 15; wherein the starting material is hydrothermally synthesized within the nitrate aqueous solution at a temperature below 500° C.

18. A method according to claim 15; wherein the starting material is hydrothermally synthesized within the nitrate aqueous solution at a temperature in the range of 370° C. to 420° C.

19. A method according to claim 15; wherein the nitrate aqueous solution contains aklali nitrate.

20. A method according to claim 19; wherein the alkali nitrate is selected from the group consisting of $NaNO_3$, $KNO_3$ and $LiNO_3$.

21. A method according to claim 15; wherein the nitrate aqueous solution comprises 3 mol aqueous solution of nitrate.

22. A method according to claim 15; wherein the starting material is hydrothermally synthesized within the nitrate aqueous solution at a pressure lower than 1000 $kg/cm^2$.

23. A method according to claim 22; wherein the starting material is hydrothermally synthesized within the nitrate aqueous solution at a pressure of about 750 $kg/cm^2$.

24. A method according to claim 15; wherein the starting material is hydrothermally synthesized within the nitrate aqueous solution within a pressure vessel so that the calcium carbonate single crystal is deposited on the inside surface of the pressure vessel.

25. A method according to claim 15; wherein the calcium carbonate single crystal is grown as a film on a seed crystal.

26. A method according to claim 15; wherein the starting material is hydrothermally synthesized within the nitrate aqueous solution within a pressure vessel, the starting material being placed at the bottom of the pressure vessel and a seed crystal being placed at an upper portion of the pressure vessel so that the calcium carbonate single crystal is grown as a film on the seed crystal.

27. A method according to claim 26; wherein a baffle is disposed in the pressure vessel between the bottom and upper portion thereof to produce a temperature difference therebetween.

28. A method according to claim 27; wherein the temperature difference is about 50° C.

* * * * *